United States Patent [19]

Anagnostopoulos et al.

[11] 4,394,675
[45] Jul. 19, 1983

[54] TRANSPARENT ASYMMETRIC ELECTRODE STRUCTURE FOR CHARGE COUPLED DEVICE IMAGE SENSOR

[75] Inventors: Constantine N. Anagnostopoulos, Mendon; Teh-Hsung Lee, Webster, both of N.Y.

[73] Assignee: Eastman Kodak Company, Rochester, N.Y.

[21] Appl. No.: 244,366

[22] Filed: Mar. 16, 1981

[51] Int. Cl.³ .................... H01L 29/78; H01L 29/04
[52] U.S. Cl. ..................................... 357/24; 357/59
[58] Field of Search ........................ 357/24 LR, 30

[56] References Cited

U.S. PATENT DOCUMENTS

| | | | |
|---|---|---|---|
| 3,941,630 | 3/1976 | Larrabee | 156/13 |
| 3,988,613 | 10/1976 | Brown et al. | 357/23 C |
| 4,012,767 | 3/1977 | Brown et al. | 357/30 |
| 4,141,024 | 2/1979 | Kano et al. | 357/24 |
| 4,194,213 | 3/1980 | Kano et al. | 357/24 LR |
| 4,242,694 | 12/1980 | Koike et al. | 357/24 LR |
| 4,280,141 | 7/1981 | McCann et al. | 357/24 LR |

OTHER PUBLICATIONS

Sequin et al., "Charge-Coupled Area Image Sensor Using Three Levels of Polysilicon" IEEE Trans. Electron Devices vol. ED-21 (11/74) pp. 712-720.
Abe et al., "A CCD Imager with SiO₂ Exposed Photosensor Arrays" IEEE Int. Electron Devices Meeting (12/77) pp. 542-545.
"Charge Transfer Devices" by Sequin and Tompsett, Academic Press, 1975, at p. 38.

*Primary Examiner*—Gene M. Munson
*Attorney, Agent, or Firm*—Thomas H. Close

[57] ABSTRACT

A charge coupled device (CCD) image sensor comprises a semiconductor substrate having a transparent insulating layer formed on a light receiving surface thereof, a first set of transfer electrodes disposed in groups of one or more electrodes, said groups being disposed in spaced-apart relation on the insulating layer, and a second set of transfer electrodes disposed on the insulating layer, the electrodes of the second set being disposed in the spaces between the groups of electrodes of the first set and being substantially wider and more uniformly transparent in the visible region of the spectrum than the electrodes of the first set. In the preferred embodiment of the invention, the CCD is a three-phase, three-level device, comprising two levels of slightly overlapping polysilicon electrodes which constitute the first set of transfer electrodes and a third level of substantially unpatterned conductive transparent metal oxide which constitutes the second set of transfer electrodes.

5 Claims, 11 Drawing Figures

FIG. 4
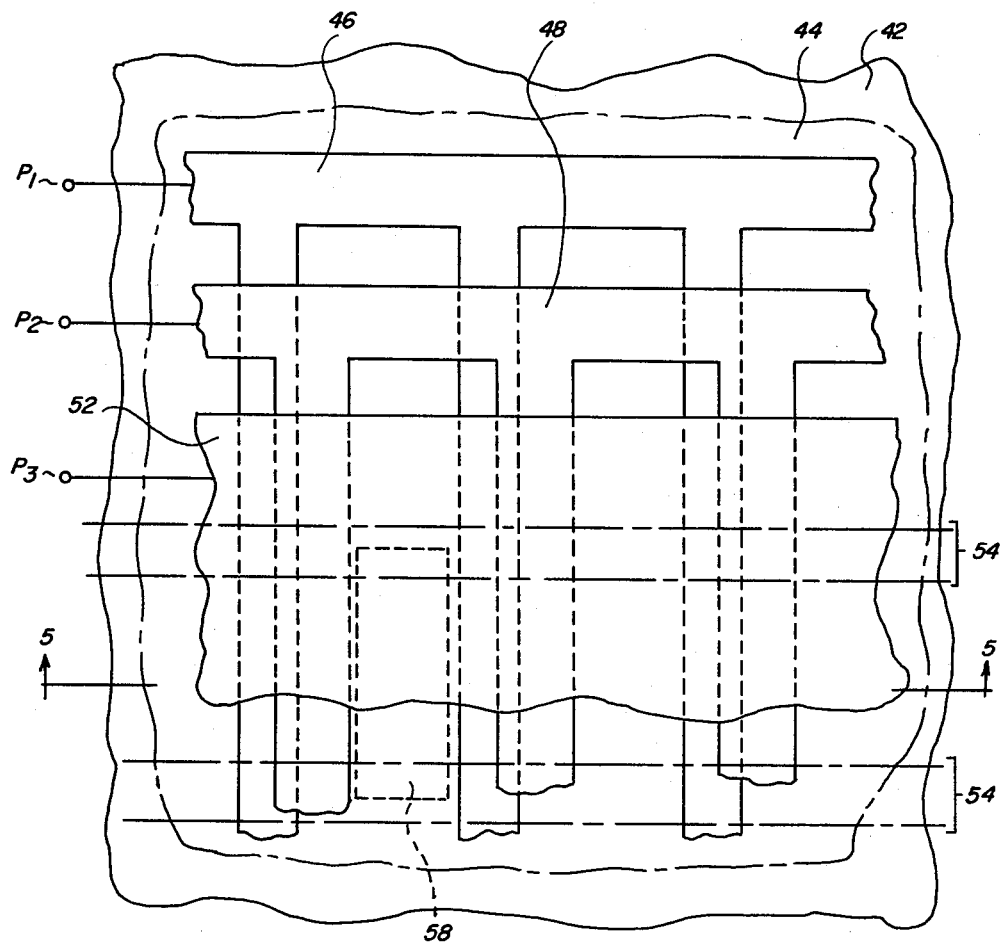
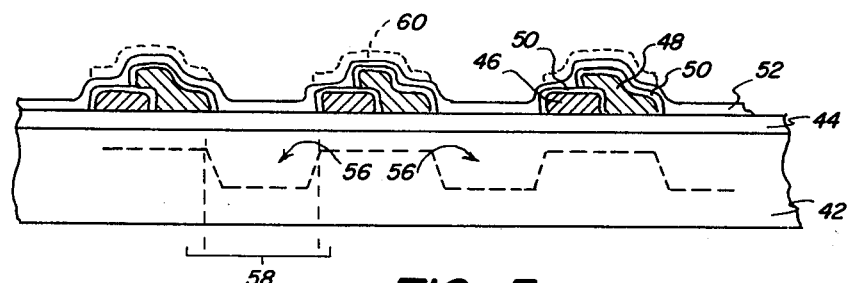
FIG. 5

TRANSPARENT ASYMMETRIC ELECTRODE STRUCTURE FOR CHARGE COUPLED DEVICE IMAGE SENSOR

BACKGROUND OF THE INVENTION

1. Field of the Invention

This invention relates in general to solid state image sensors, and more particularly, to a novel electrode structure for the image sensing portion of a charged coupled device image sensor suitable for use as a color image sensor.

2. Description of the Problem

A charge coupled device (CCD) comprises an arrangement of adjacent metal-insulator-semiconductor (MIS) capacitors on a common semiconductor substrate. A proper voltage applied to the electrode of an MIS capacitor repels majority carriers in the region of the substrate beneath the electrode, thereby creating a potential well, momemtarily depleted of free carriers. Minority carriers introduced into such a potential well can be moved about in the substrate, from one MIS capacitor to an adjacent one by properly manipulating the voltages applied to the capacitor electrodes, called "transfer" electrodes in a CCD. If a photon is absorbed in the semiconductor substrate of a CCD to produce an electron-hole pair near the depletion region of a propery biased MIS capacitor, the minority carrier will be drawn to the depletion region and held in the potential well there. A potential well in a CCD can thus accumulate charge proportional to the total amount of light incident on a portion of the CCD.

It is well known to use a CCD array as an image sensor. FIG. 1 shows a prior art CCD image sensor having a frame transfer type readout organization. The image sensor comprises an image sensing array 10 which produces an imagewise pattern of photocharge in response to imagewise illumination, a storage array 12, which receives the imagewise charge pattern from sensing array 10 and temporarily stores it during readout, and a readout register 14 which transfers the imagewise charge pattern, line-by-line, from storage array 12 to an output diode 16. The image sensing array comprises a plurality of CCD shift registers 18, arranged side-by-side, and having transfer electrodes 20. The device illustrated in FIG. 3 is a three-phase device having three sets of interdigitated transfer electrodes to which three-phase transfer signals $P_1$, $P_2$, and $P_3$ are applied. A plurality of image sensing sites 22 are defined on the image sensing array 10 by properly setting the voltage on transfer electrodes 20.

Similarly, storage array 12 comprises a plurality of CCD shift registers extending from registers 18. Storage array 12 and output register 14 are shielded from light as indicated by the stippling in FIG. 1.

A CCD image sensing array can be made color sensitive by placing an array of color filters over the image sensing sites 22. Ideally, for such color image sensing applications, the CCD image sensor should have substantially uniform spectral response across the visible region of the spectrum. In the simplest early CCD image sensors, the transfer electrodes were patterned from a thin layer of metal (e.g. aluminum) and were therefore opaque to visible light. Light reached the semiconductor substrate through small gaps between the electrodes. Although this arrangement resulted in poor light collecting efficiency, since most of the light reaching the device was reflected from or absorbed by the aluminum electrodes, the spectral sensitivity in the visible region was very good. Unfortunately, the gaps between the electrodes were prone to shorting, and the presence of the gaps produced "fringing" fields that reduced the transfer efficiency of the CCD. In an effort to remedy the problems caused by gaps between electrodes, and to improve the light collecting efficiency of CCD image sensors, semitransparent electrodes of highly doped polysilicon were employed.

A portion of an image sensing array constructed with polysilicon electrodes will now be described with reference to FIGS. 2 and 3. A semiconductor substrate 22, e.g. lightly doped monocrystalline silicon, is covered with an insulating layer 24 of $SiO_2$. Three sets of transfer electrodes, 26, 28 and 30, are formed on the insulating layer by forming respective layers of highly doped polysilicon and patterning the polysilicon using standard photolithographic techniques. Each set of transfer electrodes is common to all the CCD shift registers 18 (see FIG. 1). Highly doped channel stopping regions 32 separate and define adjacent CCD shift registers. The polysilicon electrodes slightly overlap, and are electrically insulated from each other by layers 34 of $SiO_2$ grown on each set of transfer electrodes after patterning. The set of electrodes are supplied with three-phase clock signals $P_1$, $P_2$, and $P_3$, respectively. During exposure, the voltages on the sets of transfer electrodes are held such that a potential well 35 is formed under electrodes 26 and 30 (see FIG. 3). An image sensing site 22 is thereby defined between the midpoints of adjacent channel stopping regions 32 and the midpoints of adjacent phase-two transfer electrodes 28. Since the transfer electrodes overlap, the problems associated with gaps between electrodes are eliminated, and since polysilicon is semitransparent, the entire surface area of the device is used to collect light. The light collecting efficiency of the polysilicon electrode device is greatly improved over the metal electrode device.

Unfortunately, however, polysilicon does not transmit the visible spectrum uniformly, absorbing more strongly in the blue region of the spectrum (below about 450 nm). Consequently, the blue response of the polysilicon electrode sensor is marginal for use as a color image sensor. Furthermore, since the amount of blue light absorbed by a polysilicon electrode is a strong function of the thickness of the polysilicon, the blue response is much lower in the areas where the electrodes overlap, making the spectral response of the sensor nonuniform from place to place on the surface of the sensor. This causes a problem when color filters are applied to the sensor, since a slight misalignment of the location of the filters over the image sensing sites can cause large variations in the spectral sensitivity of the sites.

A number of approaches have been proposed for improving the spectral response (e.g. the blue response) in CCD image sensors, while maintaining relatively high light gathering efficiency. For example, U.S. Pat. No. 4,141,024 issued Feb. 20, 1979 to Kano et al, teaches forming partial gaps between adjacent polysilicon electrodes, where light may enter the substrate more directly. The gaps are disposed partially over the channel stopping regions, thereby reducing the effects due to fringing fields, however the spectral response still varies across an image sensing site.

It has also been suggested that conductive transparent metal oxide, with uniform transmission throughout the visible spectrum, be employed in CCD image sensors to form the transfer electrodes. (See U.S. Pat. No. 3,941,630 issued Mar. 2, 1976 to Larrabee). Unfortunately, transparent metal oxide is difficult to pattern, and the processes required to pattern it are not naturally compatible with conventional silicon processing techniques. In the example described in the Larrabee patent, gaps are left between the transparent metal oxide electrodes, reminiscent of the problem causing gaps in the early aluminum electrode CCD's. Thus, the problem faced by the present inventors was to provide a CCD image sensor having substantially uniform spectral sensitivity in the visible region of the spectrum, relatively high light gathering efficiency, and uniform spectral response across the image sensing sites of the sensor.

SOLUTION TO THE PROBLEM-SUMMARY OF THE INVENTION

The above-noted problems are solved according to the present invention by providing a charge coupled image sensing device comprising a semiconductor substrate having a transparent insulating layer formed on a light receiving surface thereof, a first set of transfer electrodes disposed in groups of one or more electrodes, said groups being disposed in spaced apart relation on the insulating layer, and a second set of transfer electrodes disposed on the insulating layer, the electrodes of the second set being disposed in the spaces between the groups of electrodes of the first set and being substantially wider and more uniformly transparent in the visible region of the spectrum than the electrodes of the first set. In the preferred embodiment of the invention, the CCD is a three-phase, three-level device, comprising two levels of slightly overlapping polysilicon electrodes which constitute the first set of transfer electrodes and a third level of substantially unpatterned conductive transparent metal oxide which constitutes the second set of electrodes.

In an alternative embodiment, the third level is an unpatterned layer of polysilicon, which constitutes the second set of electrodes, the polylsilicon of the unpatterned layer being substantially thinner than the polysilicon of the patterned levels, thereby rendering the second set of electrodes substantially more uniformly transparent than the first set, while maintaining acceptable levels of conductivity in the electrodes.

BRIEF DESCRIPTION OF THE DRAWINGS

The invention will be described with respect to the drawings, wherein:

FIG. 4 is a fragmentary top-view showing the electrode structure of an image sensing array according to the present invention;

FIG. 5 is a cross-sectional view taken along line 5—5 in FIG. 4; and

DESCRIPTION OF THE PREFERRED EMBODIMENTS

Figure 1:
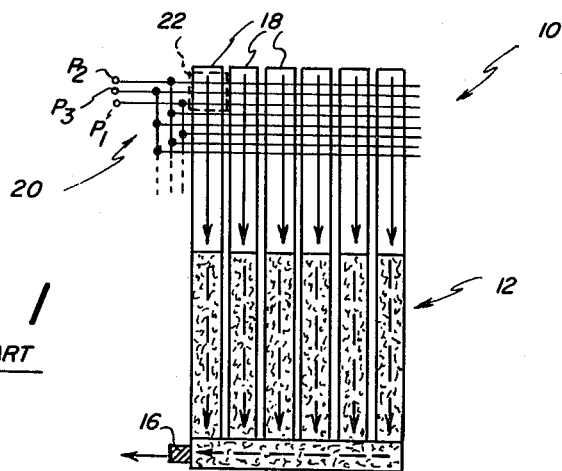
FIG. 1 is a schematic diagram showing a prior art CCD image sensor of the frame transfer type.
Figure 2:
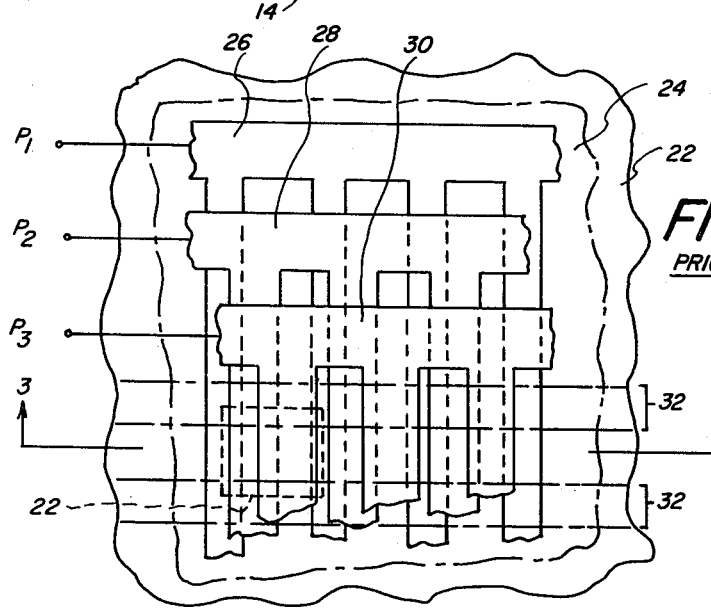
FIG. 2 is a fragmentary top-view showing the electrode structure of the image sensing array used in the prior art sensor shown in FIG. 1.
Figure 3:
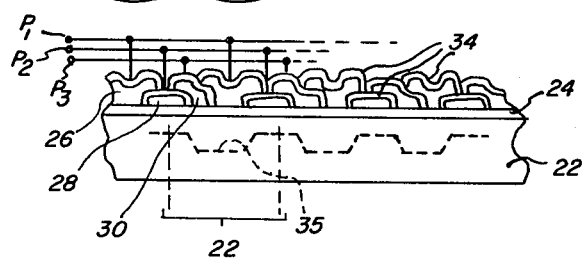
FIG. 3 is a cross-sectional view taken along line 3—3 in FIG. 2.
Figure 6:
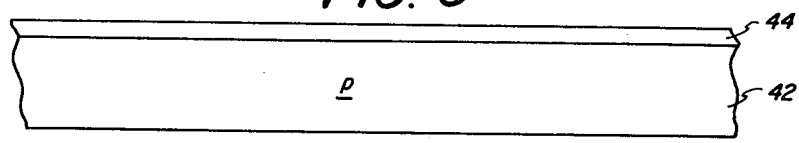
FIGS. 6–11 are cross-sectional views used for explaining the process of making an electrode structure according to the present invention.

An example of the improved electrode structure for a CCD image sensing device according to the present invention will now be described with reference to FIGS. 4 and 5.

The electrode structure is constructed on a lightly doped semiconductor substrate 42, (e.g. p-type monocrystalline silicon) covered with a layer 44 of insulating material (e.g. $SiO_2$). A first set of semitransparent or opaque electrodes comprises spaced-apart groups of partially overlapping first and second phase transfer electrodes 46 and 48 formed on insulating layer 44. Transfer electrodes 46 and 48 are formed sequentially, for example from layers of highly doped polysilicon or aluminum, and are insulated from each other by insulating layers 50 of $SiO_2$ or aluminum oxide respectively.

A second set of transfer electrodes 52 is preferably formed by a substantially unpatterned layer of transparent conductive material. By "substantially unpatterned", it is meant that the electrode material is not patterned in the photosensitive region of the device to form individual electrodes, but may be grossly patterned in the form of a relatively large square or rectangle overlying the photosensitive region. The transfer electrodes of the second set are substantially wider than the electrodes of the first set, preferably at least twice as wide. In the preferred embodiment of the invention, the unpatterned layer 52 comprises a layer of conductive transparent metal oxide such as cadmium, tin, or indium oxide or a mixture of these. Since the layer is unpatterned in the photosensitive region of the device, and needs to be only grossly patterned around the periphery thereof, the construction of the transparent metal oxide electrodes is greatly simplified. In an alternative embodiment of the invention, the first set of transfer electrodes is formed of highly doped polysilicon, and the second set of transfer electrodes comprises a layer 52 of highly doped polysilicon, that is substantially thinner than the polysilicon in the first set of electrodes, thereby rendering the second set of transfer electrodes more transparent in the blue region of the visible spectrum and hence more uniformly transparent in the visible region of the spectrum. By "substantially thinner" it is meant that the polysilicon in the patterned electrodes is at least twice as thick as that of the unpatterned layer. Making a layer 52 of polysilicon unpatterned reduces the total resistance of the electrode (as measured in squares) since the resistance is a function of the aspect ratio of the electrode. Normally, such a reduction in resistance would be exactly compensated for by an increase in capacitance, since the capacitance is proportional to the area of the electrode. However, in this case, where the unpatterned electrode 52 covers the patterned electrodes 46 and 48, the capacitance increases more slowly than a direct function of the area of the electrode. As a result, the sheet resistance of the unpatterned electrode (as measured in $\Omega/\square$) can be increased, by making the polysilicon layer thinner, without increasing the response time (as determined by the RC time constant) of the electrode.

Channel stopping regions 54, comprising for example regions of a high doping concentration in the substrate and/or thicker field oxide, separate and define the adjacent CCD transfer registers. The sets of electrodes are supplied with three-phase clock signals $P_1$, $P_2$, and $P_3$, respectively. During exposure, the voltages on the sets of transfer electrodes are held at levels such that potential wells 56 (see FIG. 5) are formed beneath the unpatterned third-phase electrodes 52. Image sensing sites 58 are defined by the third-phase electrodes 52 between the mid points of adjacent channel stopping regions 54. In the preferred embodiment of the invention, light is not allowed to enter the substrate 42 from the regions covered by first and second phase electrodes 46 and 48. This is achieved automatically in the case where the material forming electrodes 46 and 48 is opaque (e.g. aluminum) but when the material is polysilicon, light-blocking means such as aluminum strips 60 (shown in phantom in FIG. 5) may be formed on the surface of the device in the area over electrodes 46 and 48. Thus an image sensing array having relatively efficient light collection and uniform spectral response across the visible region of the spectrum is provided.

One method of constructing a CCD image sensor according to the present invention will now be described with reference to FIGS. 6–11.

Figure 7:
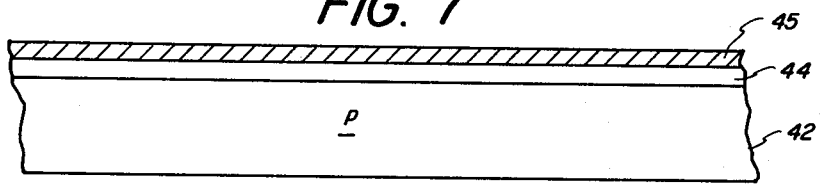
Figure 8:
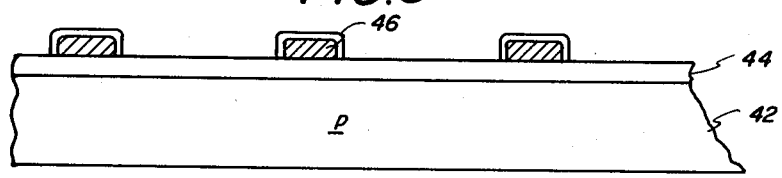

Starting with a p-type silicon substrate 42, doped to 20 to 40 $\Omega$/cm, source and drain region (not shown in FIG. 6) are formed by phosphorous doping using standard diffusion techniques, and channel stop regions (not shown in FIG. 6) are formed by ion implanting boron at 70 KEV to a concentration of $4 \times 10^{14}$ atoms per cm$^2$. A so-called gate oxide layer 44, 0.14 $\mu$m thick is formed on the substrate 42 by thermal oxidation. Next, as shown in FIG. 7, a layer 45 of polysilicon 6, 500 Å thick is deposited on the gate oxide layer 44 by chemical vapor deposition techniques. The polysilicon is doped with phosphorous to 40 $\Omega$/☐ b contacting the layer of polysilicon with POCl$_3$ in a diffusion furnace at 950° C. The doped polysilicon layer 45 is then patterned, using standard photolithographic and plasma etching techniques, to define the first-phase transfer electrodes 46, shown in FIG. 8. Preferably, the first-phase transfer electrodes are about 3 $\mu$m wide. A layer of isolation oxide 47 is formed on the patterned electrode 46 by thermal oxidation of the polysilicon.

Figure 9:
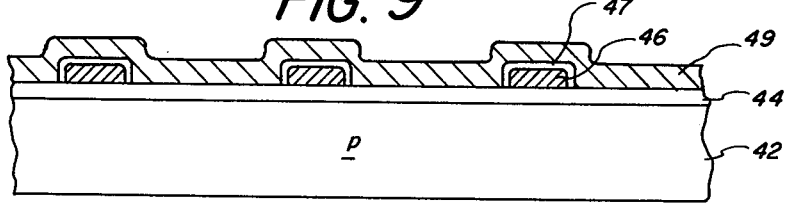
Figure 10:
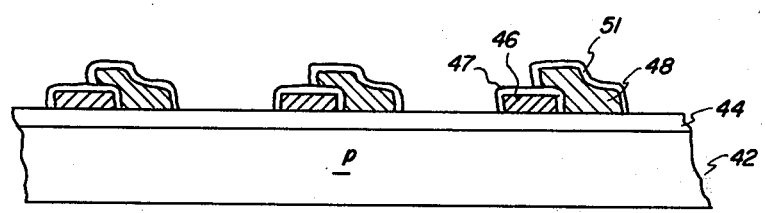

Next, as shown in FIG. 9, a second layer of polysilicon 49, 5,000 Å thick is deposited on the surface of the device using standard vapor deposition techniques. The polysilicon layer 49 is doped with phosphorus to 40 $\Omega$/☐ by contacting the layer of polysilicon with POCl$_3$ in a diffusion furnace at 950° C. The doped polysilicon layer is then patterned, using standard photolithographic and plasma etching techniques, to define the second-phase transfer electrodes 48, as shown in FIG. 10. A layer of isolation oxide 51 is formed on the pattern of electrodes by thermal oxidation of the polysilicon. Preferably, the effective width of the second-phase transfer electrode is also about 3 $\mu$m. The effective width of the electrode is that portion of the total width of the electrode not shielded from the substrate by an underlying electrode. As shown in FIG. 10, the second-phase electrodes slightly overlap the first-phase electrodes; preferably the pairs of first and second-phase electrodes are spaced apart by about 6 $\mu$m.

Figure 11:
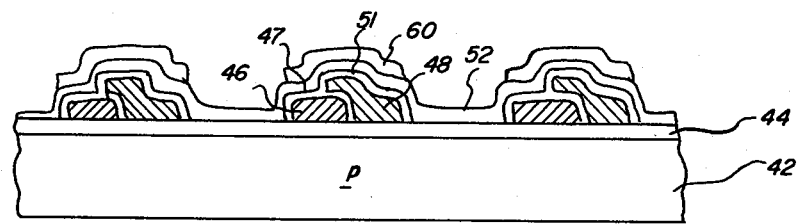

Referring now to FIG. 11, a layer of transparent metal oxide 5,000 Å thick comprising $\simeq$70% cadmium oxide and $\simeq$30% tin oxide, by weight, is deposited over the surface of the device by simultaneous sputtering of the CdO and SnO$_2$. The layer of transparent metal oxide is grossly patterned to remove oxide from the area of the device outside the image sensing area by: depositing a layer of chromium, approximately 1000 Å thick, over the surface of the device; and patterning the chrome to the shape of the desired transparent electrode structure using standard photolithographic techniques and a chromium specific etchant comprising nitric acid (4%) water (80%) and ceric ammonium nitrate (16%). This etchant attacks the chromium, but leaves the transparent metal oxide substantially unaffected. The chrome patterns are then employed as a resist to etch the transparent metal oxide, using hydrochloric acid as an etchant. The chromium is removed from the grossly patterned transparent electrode (except in areas where electrical contact is to be made) by using the chromium specific etchant employed above. Finally, a layer of aluminum is deposited over the surface of the device using standard vapor deposition techniques, and the aluminum is patterned to leave opaque masks 60 over the first- and second-phase electrodes 46 and 48 and to provide electrical contacts.

A CCD image sensor having asymmetric transfer electrodes in a light sensing array according to the present invention, is operated in the same manner as the prior art CCD image sensor. For example, if the image sensor is of the frame transfer type, as shown in FIG. 1, the transfer electrodes of the image sensing array are held at fixed potential during an exposure period, while photocharge is accumulated in the photosensing sites. After a predetermined exposure time, the transfer electrodes of the image sensing array 10 and the temporary storage array 12 are operated in unison at a high frequency to quickly transfer the accumulated charge pattern to the storage array. Then the transfer electrodes of the image sensing array 10 are held fixed for another exposure while the accumulated charge pattern is shifted line-by-line out of the storage array 12 at a standard television field rate.

With the relatively wide, uniformly transparent windows provided by the third-phase electrodes 52, the light collection efficiency of the image sensing array is high while at the same time, maintaining uniform spectral sensitivity at each sensing site.

The invention has been described with respect to preferred embodiments thereof, but it will be recognized that modifications and variations may be affected within the spirit and scope of the invention. For example, although the preferred embodiment of the invention has been described with reference to a three-phase CCD device, multi-phase sensors having two or four phases could also employ the invention. Furthermore, although the preferred embodiment of the device was described as having a substantially unpatterned layer of transparent metal oxide forming the wider, more uniformly transparent electrodes, this layer of transparent metal oxide could be patterned. Also, the ratio of the narrow electrodes to wide transparent electrodes was described as 2:1 (e.g. 6 $\mu$m to 3 $\mu$m), but larger ratios and hence higher light gathering efficiencies are possible, recognizing that there exists a trade-off between light gathering efficiency and total charge carrying capacity of the CCD device.

We claim:

1. A frame transfer type charge coupled image sensing device wherein photocharges are accumulated under a transfer electrode in the transfer channel of a CCD shift register, comprising:
   (a) a semiconductor substrate;
   (b) a transparent insulating layer formed on a light receiving surface of said substrate;
   (c) a first set of transfer electrodes comprising a plurality of electrodes disposed in groups of one or more electrodes, said groups being disposed in spaced-apart relation on said insulating layer;

(d) a second set of transfer electrodes, disposed on said insulating layer between said groups of first transfer electrodes, said transfer electrodes of said second set being substantially wider than the transfer electrodes of said first set, and substantially transparent in the visible region of the spectrum; and (e) means for blocking light from passing through said first set of transfer electrodes.

2. The invention claimed in claim 1, wherein said first set of transfer electrodes comprises a layer of doped polysilicon patterned to define a plurality of spaced apart electrodes, the spacing between individual electrodes being substantially greater than the width of one of said individual electrodes, and said second set of transfer electrodes comprises a substantially unpatterned layer of conductive transparent material disposed over said first set of transfer electrodes.

3. The invention claimed in claim 2, wherein said substantially unpatterned layer is a layer of transparent metal oxide.

4. The invention claimed in claim 2, wherein said substantially unpatterned layer is a layer of doped polysilicon, substantially thinner than said patterned layer.

5. The invention claimed in claim 1, wherein said CCD is a three-phase, three-level device, said first set of transfer electrodes comprises groups of first- and second-phase overlapping polysilicon electrodes, and said second set of transfer electrodes comprises a layer of substantially unpatterned transparent metal oxide disposed over said first- and second-phase polysilicon electrodes.

* * * * *